United States Patent [19]
Fassberg et al.

[11] Patent Number: 5,242,864
[45] Date of Patent: Sep. 7, 1993

[54] POLYIMIDE PROCESS FOR PROTECTING INTEGRATED CIRCUITS

[75] Inventors: Maxine Fassberg, Beaverton; Melton C. Bost, Hillsboro; Krishnamurthy Murali, Portland; Peter K. Charvat, Portland; Lynn A. Price, Portland; Robert C. Lindstedt, Portland, all of Oreg.

[73] Assignee: Intel Corporation, Santa Clara, Calif.

[21] Appl. No.: 893,765

[22] Filed: Jun. 5, 1992

[51] Int. Cl.$^5$ .......................................... H01L 21/469
[52] U.S. Cl. ..................... 437/228; 437/203; 437/981; 156/644; 156/659.1; 430/317; 148/DIG. 75
[58] Field of Search ............... 430/311, 313, 314, 317; 156/644, 659.1, 668, 653; 437/225, 228, 229, 981, 203; 148/DIG. 75

[56] References Cited

U.S. PATENT DOCUMENTS

| | | |
|---|---|---|
| 4,369,090 | 1/1983 | Wilson et al. ................. 156/644 |
| 4,411,735 | 10/1983 | Belani ........................... 156/659.1 |
| 4,618,878 | 10/1986 | Aoyama et al. ............... 156/644 |
| 4,827,326 | 5/1989 | Altman et al. ................ 357/67 |
| 4,830,706 | 5/1989 | Horwath et al. ............. 156/643 |
| 4,846,929 | 7/1989 | Bard et al. .................... 156/630 |
| 4,857,143 | 8/1989 | Glenning et al. ............ 156/668 |
| 4,880,722 | 11/1989 | Moreau et al. ............... 430/192 |

OTHER PUBLICATIONS

Naito, N., et al., "Development Characteristics of Photoactive Polyimide", Electronics and Communications in Japan, Part 2, vol. 69, No. 9, 1986, pp. 32-38.

Primary Examiner—T. N. Quach
Attorney, Agent, or Firm—Blakely, Sokoloff, Taylor & Zafman

[57] ABSTRACT

A process for forming a protective polyimide layer over a semiconductor substrate includes the steps of curing a deposited polyamic acid layer at a temperature which is sufficient to reduce the etch rate of the acid layer when subsequently exposed to a developer. After formation of a photoresist masking layer over the polyamic acid, the substrate is exposed to a developer to define a plurality of bonding pad openings therein. The developer permeates into the acid layer to form a salt in the regions beneath the openings. Subsequent hardbaking imidizes the polyamic acid, but not the salt regions. Removing the photoresist layer also develops the polyimide which removes the salt regions to expose the underlying bonding pads.

17 Claims, 3 Drawing Sheets

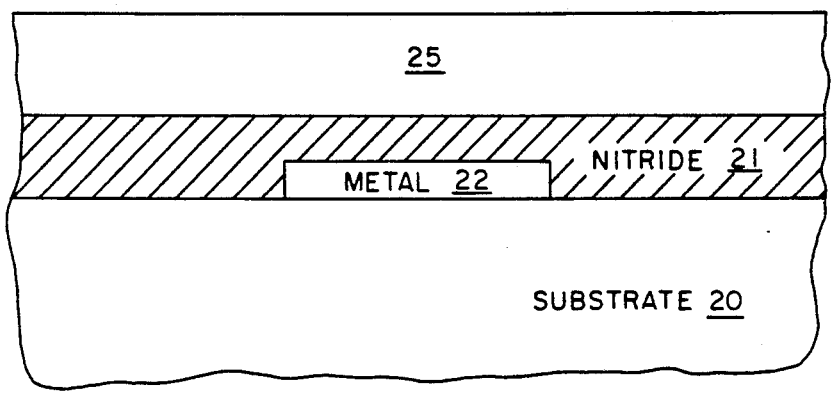
FIG_1
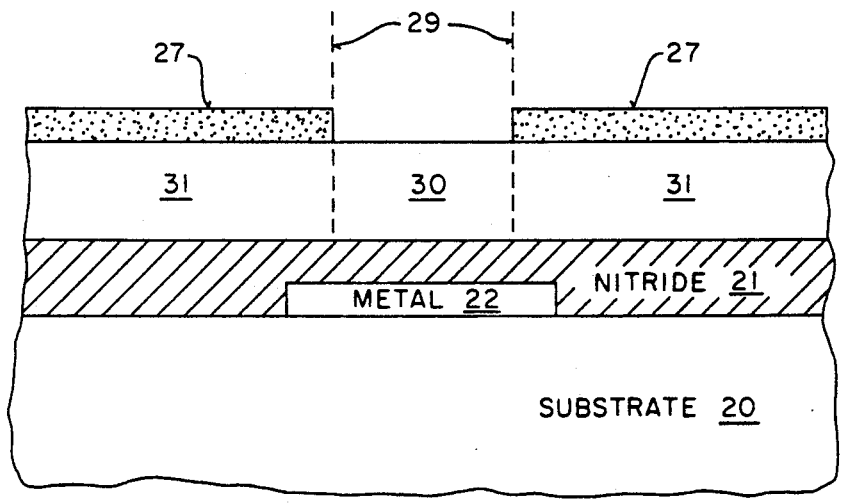
FIG_2
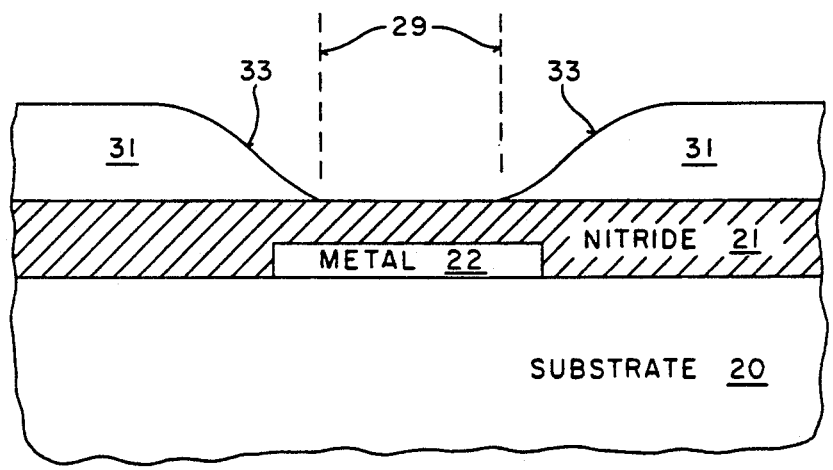
FIG_3

FIG_4
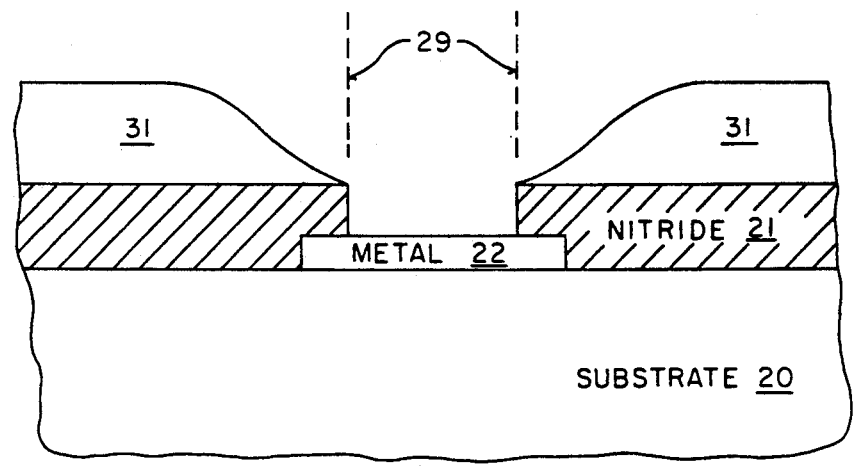
FIG_5
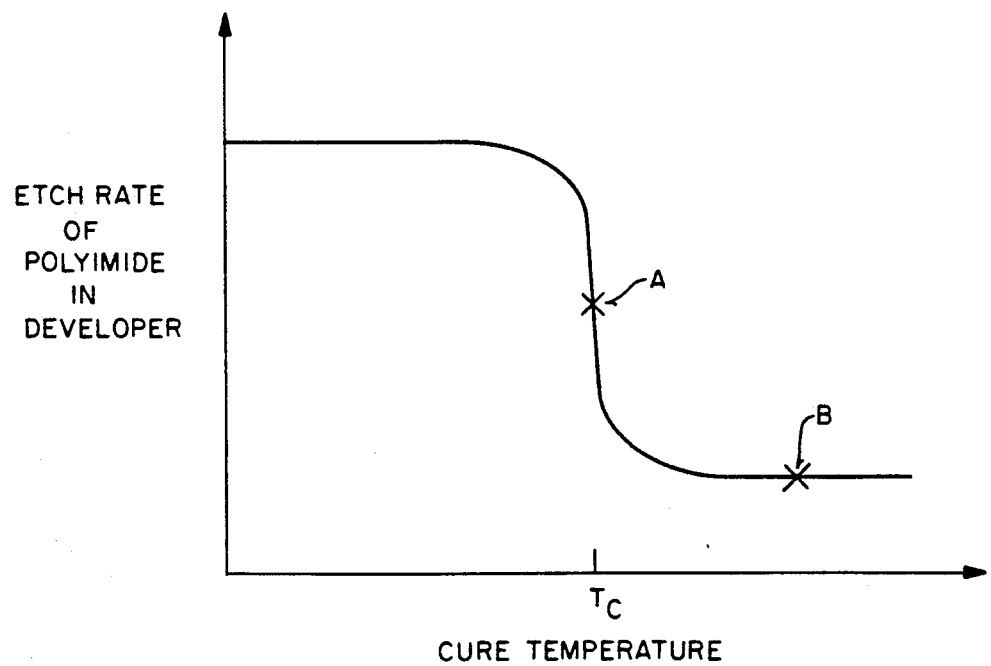

FIG _ 6A
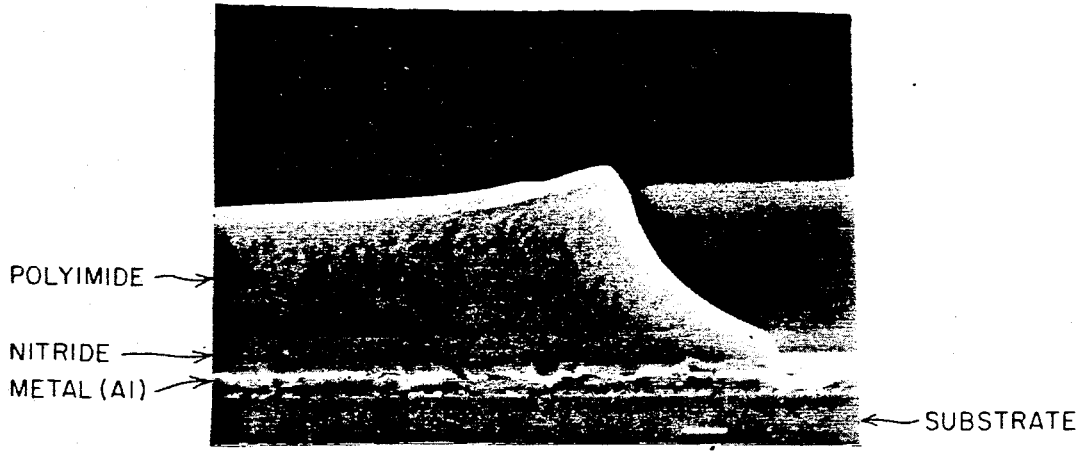
FIG _ 6B
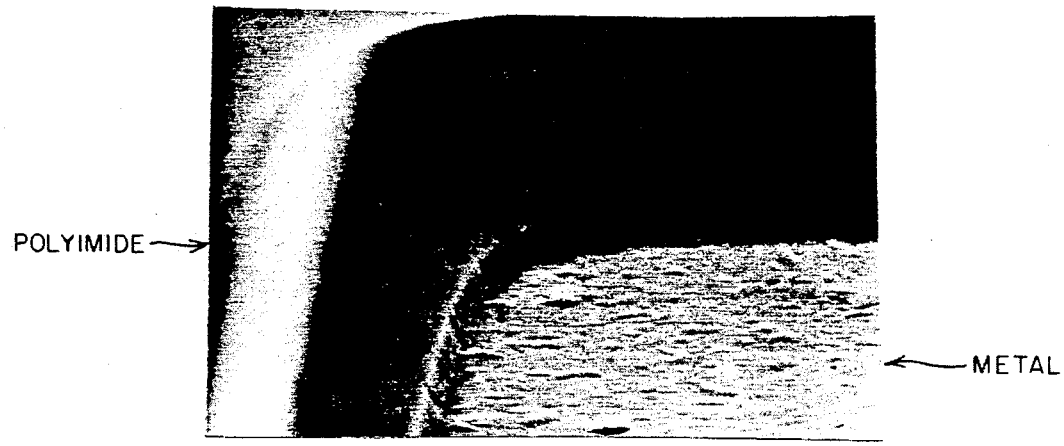

POLYIMIDE PROCESS FOR PROTECTING INTEGRATED CIRCUITS

FIELD OF THE INVENTION

The present invention relates generally to the field of semiconductor processing. More specifically, the invention relates to methods for protecting the surface of the semiconductor substrate against mechanical damage.

BACKGROUND OF THE INVENTION

Polyimide processing is a well understood semiconductor art designed to give extra protection to the surface of the silicon chip against scratching, cracking and other types of mechanical damage. Most often, mechanical damage occurs assembly, packaging, or any subsequent handling of the die. As a passivation layer, polyimide also guards against thin film cracking which frequently results from the packaging of very large dies into plastic packages.

Existing polyimide processes are compatible with standard forms of wire bonding technology. Normal defects such as cracks or flakes which arise from the interaction of the polyimide with photoresist, do not normally pose a problem for this standard bonding technology. However, as newer forms of bonding technology come into use—such as tape automated bonding (TAB) which utilizes gold bumps formed on the bonding pads of the semiconductor substrate—the problems associated with prior art polyimide processes have become more troublesome.

For example, one of the main difficulties with prior art polyimide processes is that the profiles (i.e., slopes) of the polyimide at the bonding pad edges are not consistent. Rough edges or films having numerous flakes and other defects are pervasive throughout the prior art. In other cases, pieces of photoresist can sometimes become deposited on the surface of the bonding pads causing spikes of unetched passivation layer to be left behind on the bonding pad itself. Although these problems have not prohibited the use of conventional polyimide processes in conjunction with standard wire bonding techniques, these shortcomings are unacceptable in the newer, more advanced bonding. For instance, TAB compatible gold bump bonding generally requires consistent polyimide edge profiles which are relatively defect-free. Moreover, the slopes of the polyimide openings at the edges of the bonding pads must be formed at such an angle so as to allow good step metal coverage. (During the first stage of the TAB process titanium tungsten (TiW) is sputtered as a barrier metal layer.) If the walls of the polyimide layer are too steep, as in some prior art processes, the barrier metal layer will not adhere properly to the polyimide surface.

SUMMARY OF THE INVENTION

The above problems characteristic of the prior art are overcome in the present invention which utilizes selective imidization of a deposited polyimide layer. According to the invented process, certain regions of the polyimide layer are imidized while others are not. The resulting polyimide process produces a smooth defect-free polyimide layer, particularly at the boundary of the bonding pad openings. Thus, the invented process is highly compatible with modern gold bump bonding technologies.

In one embodiment, the polyimide process of the present invention includes the steps of depositing a layer of polyamic acid over an insulative layer. The insulative layer covers the bonding pads on the die. Next, the polyamic acid layer is cured at a temperature which is sufficient to reduce the etch rate of the acid layer when subsequently exposed to a developer. A layer of photoresist is then deposited over the polyamic acid layer. A developer solution is then applied to the photoresist layer to define a plurality of openings therein. Because of the previous curing step the etch rate of the underlying acid layer is lowered so that the developer removes only a negligible amount of the acid layer. Instead of removing the underlying acid layer, the developer permeates into the regions beneath the openings and transforms the polyamic acid layer therein to a salt.

Once the photoresist layer has been completely developed, the substrate is baked in order to imidize the polyamic acid layer. Imidization occurs everywhere except in those regions where salt had been formed.

The next step in the process is to remove the photoresist layer. At the same time, the salt regions are removed, leaving only the polyimide layer behind. Etching the insulative layer in alignment with the openings exposes the bonding pads and produces a smooth, defect-free polyimide edge profile.

BRIEF DESCRIPTION OF THE DRAWINGS

The present invention will be understood more fully from the detailed description which follows and from the accompanying drawings. The drawings, however, should not be taken to limit the invention to the specific embodiments shown, but are for explanation and understanding only. For example, the relative layer thicknesses shown in the drawings should not be construed as representing the actual thicknesses present in the current process.

FIG. 1 is a cross-sectional elevation view of a substrate processed in accordance with the teachings of the present invention. The view of FIG. 1 shows the substrate following deposition of insulative and polyamic acid layers overlying a metal bonding pad.

FIG. 2 is a cross-sectional view of the substrate of FIG. 1 after an opening has been defined in a photoresist layer.

FIG. 3 is a cross-sectional view of the substrate of FIG. 2 after selected imidization and removal of the photoresist layer.

FIG. 4 is a cross-sectional view of the substrate of FIG. 3 following etching of the insulative layer to expose the underlying bonding pad.

FIG. 5 is a graph showing the etch rate of polyimide as a function of cure temperature.

FIGS. 6A and 6B are SEM photographs of a semiconductor substrate processed in accordance with the present invention. FIG. 6A illustrates a cross-sectional side view of a polyimide edge region. FIG. 6B is a top perspective view of same region.

DETAILED DESCRIPTION

A process for protecting the surface of a semiconductor substrate against mechanical damage is disclosed. In the following description, numerous specific details are set forth such as specific temperatures, solutions, and dimensions, etc., to provide a thorough understanding of the present invention. It will be obvious, however, to one skilled in the art that the present invention may be practiced without these specific details. In other instances, well-known processing steps and structures have not been set forth in detail in order to avoid obscuring the present invention.

FIG. 1 illustrates a cross-sectional view of a substrate 20 on which is formed a metal bonding pad 22. Bonding pads are commonly used in semiconductor processes to provide a terminal connecting the integrated circuit formed within the silicon substrate, to the external pins of the package. Covering bonding pad 22 is a layer of silicon nitride 21. Nitride layer 21 encapsulates bonding pad 22 in an insulative layer which prevents electrical shorts from occurring. Deposited above nitride layer 21 is a layer of polyamic acid 25. The thickness of layer 25 is typically in the range of 50,000–60,000 Å thick. Practitioners in the art will appreciate that the processing steps needed to form the substrate of FIG. 1 are well understood in the art.

Following the deposition of polyamic acid layer 25, the substrate is subjected to a curing process. In the currently preferred embodiment, the curing process comprises a two-step bake. The first step is performed at approximately 90° C. and is for the purpose of removing any solvent which may be present on the substrate surface from previous processing steps. The next step in the curing process is performed at approximately 145° C., a temperature used which is significantly higher than the curing temperature in many prior art processes.

FIG. 5 illustrates a graph showing the etch rate of polyimide in a developer solution versus the cure temperature. As can be seen, the etch rate drops off rapidly at a characteristic temperature, $T_C$, which is approximately between 134°–137° C. It is within this temperature range that most prior art processes perform the curing step for the polyamic layer. This is represented by the point A on the graph of FIG. 5. In contrast, the present invention employs a cure temperature which is significantly higher than the temperature $T_C$. This is represented in FIG. 5 by point B on the graph. At this higher temperature, the etch rate of the polyimide in the developer solution is significantly lower than at point A. At the currently preferred curing temperature of 145° C., the etch rate of the polyamic acid layer in the developer solution is approximately 1000 Å/second. The reason for reducing the etch rate of the polyimide layer will become apparent shortly.

After the curing process has been completed, a layer of photoresist 27 is deposited over the surface of the substrate. The photoresist layer is then patterned and exposed to a developer solution which forms opening 29 in the photoresist layer. In conventional processes, this developing step normally etches the underlying polyamic acid layer all the way down to the nitride layer. However, due to the higher curing temperature, the etch rate is lowered sufficiently such that the underlying polyamic layer beneath opening 29 is not removed during the developing step. Instead, the developer permeates into the underlying layer to form a salt. The developer currently being used comprises a solution of tetramethyl ammonium hydroxide (TMAH) known as NSDTD-2X, which is commercially available through TOK Corporation. Note that this developer solution includes a surfactant (the notation "2X" refers to the level of surfactant). A number of other commercially available developers may also be used with satisfactory results. The net outcome of the developing step is that a salt is formed in region 30 directly beneath opening 29. The remaining regions underneath photoresist masking layer 27 are unchanged during the developing step.

Next, a hard bake is performed at a sufficiently high temperature so as to imidize the acid regions beneath the photoresist layer 27. Practitioners in the art will understand that imidization transforms the polyamic acid into a hard, rigid substance. This substance—referred to as polyimide—is indicated in FIG. 2 by regions 31. Note that the imidization step is selective; that is, salt region 30 is unchanged while regions 31 are hardened or imidized. In the currently preferred process, the hard bake step is performed at approximately 190° C. The temperature of the hard bake controls the etch rate of the polyimide in the subsequent processing step.

Once the polyamic acid layer has been selectively imidized by hard baking, the photoresist layer 27 is stripped using a solvent. The photoresist stripper in current use is known by the name PRS3000, and is commercially available through J.T. Baker Corporation. Resist stripping also develops the exposed polyimide. The resulting cross-sectional profile after stripping and developing is shown in FIG. 3. In FIG. 3, opening 29 is defined by the edges of polyimide regions 31. The edge profile of the polyimide layer exhibits a smooth surface 33 which gradually slopes from the surface of nitride layer 21 to the full thickness of polyimide layer 31. Such a graded edge profile is commonly referred to as a "wet etch" profile. This type of profile is extremely desirable when performing sputtering steps. As explained earlier, sputtering TiW onto the substrate is a necessary step in the well-known tape automated bonding (i.e., gold bumping) process.

FIG. 4 is a cross-sectional view of the substrate following a vertical etch of nitride layer 21 that exposes the underlying bonding pad 22. During the nitride etching step, polyimide layer 31 functions as a masking layer for maintaining the size of opening 29. At this point, other well-known processing steps may be performed, depending upon the particular semiconductor process utilized. These steps, however, are not essential to the present invention.

FIGS. 6A and 6B show photographs taken by a scanning electron microscope (SEM) of an integrated circuit which has been processed in accordance with the present invention. FIG. 6A is a cross-sectional view showing the wet etch profile produced by the process of the present invention. FIG. 6B shows a perspective view of the same bonding pad region. As can be seen, the polyimide surface is characterized by defect-free, smoothly graded slopes that provide good step coverage for subsequent sputtering steps.

What is claimed is:

1. A process for protecting the surface of a semiconductor substrate on which are formed a plurality of bonding pads, said pads being covered by an insulative layer, said process comprising the steps of:

depositing a layer of polyamic acid over said insulative layer;

curing said polyamic acid layer at a temperature which sufficiently reduces the etch rate of said acid layer when subsequently exposed to a developer solution;

depositing a layer of photoresist over said polyamic acid layer;

applying said developer solution to said photoresist layer to define a plurality of openings therein, said developer permeating into said acid layer in the regions beneath said openings to form a salt compound therein;

baking said substrate to harden said acid layer, except in said regions;
removing said photoresist layer and said salt from within said regions;
etching said insulative layer in alignment with said openings to expose said bonding pads.

2. The process as defined in claim 1 wherein said curing step is performed at approximately 145° C.

3. The process as defined in claim 1 wherein said developer comprises a base solution.

4. The process as defined in claim 3 wherein said developer comprises tetramethyl ammonium hydroxide.

5. The process as defined in claim 4 wherein said developer further comprises a surfactant.

6. The process as defined in claim 4 wherein said baking step is performed at approximately 190° C.

7. The process as defined in claim 6 wherein said insulative layer comprises silicon nitride.

8. In a process for fabricating an integrated circuit on a semiconductor substrate, wherein electrical connection to said circuit is made through a plurality of bonding pads disposed on said substrate, a method of protecting said circuit from mechanical damage comprising the steps of:
depositing a layer of polyamic acid over said substrate;
curing said acid layer at a temperature which is sufficient to reduce the etch rate of said acid layer when subsequently exposed to a developer;
depositing a layer of photoresist over said acid layer;
patterning said photoresist layer;
exposing said photoresist layer to said developer to define a plurality of openings therein, said developer permeating into said acid layer in the regions beneath said openings to form a salt therein;
imidizing said polyamic acid layer, thereby converting said acid layer to a polyimide layer;
removing said photoresist layer and said salt from within said regions, said removing step forming smooth and grated edges on said polyimide layer around said regions.

9. The process as defined in claim 8 further comprising the initial step of forming an insulative layer over said bonding pads.

10. The process as defined in claim 9 further comprising the final step of etching said insulative layer exposed in said openings.

11. The process as defined in claim 10 wherein said insulative layer comprises silicon nitride.

12. The process defined in claim 8 wherein said curing step comprises the steps of:
(a) baking said substrate at a first temperature and
(b) baking said substrate at a second temperature.

13. The process as defined in claim 12 wherein said first temperature is approximately 90° C.

14. The process as defined in claim 13 wherein said second temperature is approximately 145° C.

15. The process as defined in claim 13 wherein in said imidizing step is performed at a temperature of approximately 190° C.

16. The process as defined in claim 12 wherein said developer comprises a base solution.

17. The process as defined in claim 16 wherein said developer comprises a solution of tetramethyl ammonium hydroxide which includes a surfactant.

* * * * *